US012588129B2

(12) United States Patent
Choi et al.

(10) Patent No.: US 12,588,129 B2
(45) Date of Patent: Mar. 24, 2026

(54) DISPLAY APPARATUS AND METHOD OF CONTROLLING THE SAME

(71) Applicant: SAMSUNG ELECTRONICS CO., LTD., Suwon-si (KR)

(72) Inventors: Myoungkoo Choi, Suwon-si (KR); Minhoon Lee, Suwon-si (KR); Gyonyun Kim, Suwon-si (KR); Byungkwan Kim, Suwon-si (KR); Jungjin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 112 days.

(21) Appl. No.: 18/531,296

(22) Filed: Dec. 6, 2023

(65) Prior Publication Data

US 2024/0292508 A1 Aug. 29, 2024

Related U.S. Application Data

(63) Continuation of application No. PCT/KR2023/018587, filed on Nov. 17, 2023.

(30) Foreign Application Priority Data

Feb. 24, 2023 (KR) ........................ 10-2023-0025401

(51) Int. Cl.
| | |
|---|---|
| *H05B 47/185* | (2020.01) |
| *H01L 27/12* | (2006.01) |
| *H10D 86/40* | (2025.01) |
| *H10D 86/60* | (2025.01) |

(52) U.S. Cl.
CPC ......... *H05B 47/185* (2020.01); *H10D 86/441* (2025.01); *H10D 86/60* (2025.01)

(58) Field of Classification Search
None
See application file for complete search history.

(56) References Cited

U.S. PATENT DOCUMENTS

| | | | |
|---|---|---|---|
| 10,339,851 | B2 | 7/2019 | Matsumoto |
| 11,282,434 | B1 | 3/2022 | Chan et al. |
| 11,837,182 | B2 | 12/2023 | Kim et al. |

(Continued)

FOREIGN PATENT DOCUMENTS

| | | |
|---|---|---|
| JP | 2016-212166 A | 12/2016 |
| KR | 10-0831871 B1 | 5/2008 |

(Continued)

OTHER PUBLICATIONS

International Search Report (PCT/ISA/210) issued on Mar. 12, 2024 by the International Searching Authority in International Application No. PCT/KR2023/018587.

(Continued)

*Primary Examiner* — Kenneth B Wells
(74) *Attorney, Agent, or Firm* — Sughrue Mion, PLLC

(57) ABSTRACT

Provided is a display apparatus including a substrate, a plurality of light emitting devices arranged in a two-dimensional (2D) matrix on the substrate, a power supply comprising a plurality of power lines configured to provide power to the plurality of light emitting devices, and a controller configured to control the power supply to turn on and off each power line of the plurality of power lines a plurality of times in one frame.

17 Claims, 12 Drawing Sheets

(56)        References Cited

U.S. PATENT DOCUMENTS

| | | |
|---|---|---|
| 2008/0180381 A1 | 7/2008 | Jeong et al. |
| 2011/0298775 A1* | 12/2011 | Mori .................... G09G 3/3225 |
| | | 345/211 |
| 2014/0035890 A1* | 2/2014 | Jinta .................... G09G 3/3233 |
| | | 345/55 |
| 2019/0266950 A1 | 8/2019 | Xu |
| 2021/0049957 A1 | 2/2021 | Lee |
| 2023/0057742 A1 | 2/2023 | Shin et al. |
| 2023/0230552 A1* | 7/2023 | Lee ...................... G09G 3/3426 |
| | | 345/691 |
| 2024/0127745 A1 | 4/2024 | Shin et al. |

FOREIGN PATENT DOCUMENTS

| | | |
|---|---|---|
| KR | 20-0453323 Y1 | 4/2011 |
| KR | 10-1176533 B1 | 8/2012 |
| KR | 10-2017-0025110 A | 3/2017 |
| KR | 10-2021-0135702 A | 11/2021 |
| KR | 10-2022-0139269 A | 10/2022 |
| KR | 10-2023-0015212 A | 1/2023 |
| KR | 10-2023-0110069 A | 7/2023 |
| WO | 2022/097767 A1 | 5/2022 |

OTHER PUBLICATIONS

Written Opinion (PCT/ISA/237) issued on Mar. 12, 2024 by the International Searching Authority in International Application No. PCT/KR2023/018587.

* cited by examiner

<u>10</u>

(a)

(b)

DISPLAY APPARATUS AND METHOD OF CONTROLLING THE SAME

CROSS-REFERENCE TO RELATED APPLICATIONS

This application is a continuation application of International Application No. PCT/KR2023/018587, filed on Nov. 17, 2023, in the Korean Intellectual Property Receiving Office, which claims priority from Korean Patent Application No. 10-2023-0025401, filed on Feb. 24, 2023, in the Korean Intellectual Property Office, the disclosures of which are incorporated by reference herein in their entireties.

BACKGROUND

1. Field

The disclosure relates to a display apparatus and a method of controlling the same, and to a display apparatus including a liquid crystal panel and a back light unit (BLU) and a method of controlling the same.

2. Description of Related Art

A display apparatus is a type of output apparatus that converts acquired or stored electrical information into visual information and displays the converted information to a user, and is used in various fields, such as homes and businesses.

Display apparatuses include a back light unit (BLU) that provides light to a liquid crystal panel, and the back light unit includes a plurality of point light emitting devices that may independently emit light. Light emitting devices include, for example, light emitting diodes (LEDs) or organic light emitting diodes (OLEDs).

In controlling a backlight unit of a two-dimensional (2D) active matrix structure, a source driver and a gate-driver are controlled, and a power source is additionally controlled such that individual light emitting devices may be driven in a time division manner. Among these, a method of driving a power-source using time division is referred to as sub-scan driving, and when driven by the sub-scan method, the number of integrated circuits (ICs) is reduced in proportion to the number of sub-scans.

However, in a current method using sub scan, the operation time for each line decreases in proportion to the number of sub scans. Accordingly, the off-time for each line becomes longer than the time for which an afterimage remains in the human eye, and thus users may perceive that each line is turned off.

SUMMARY

Provided are a display apparatus and a method of controlling the same that are capable of, while performing time-division driving, distributing the on-times of a light emitting device using persistence of vision (POV) to prevent a line off-state from being perceived.

Technical objectives of the disclosure are not limited to the above, and other objectives will be apparent to those of ordinary skill in the art based on the following description.

According to an aspect of the disclosure, there is provided a display apparatus including: a substrate: a plurality of light emitting devices arranged in a two-dimensional (2D) matrix on the substrate: a power supply including a plurality of power lines configured to provide power to the plurality of light emitting devices; and a controller configured to control the power supply to turn on and off each power line of the plurality of power lines a plurality of times in one frame.

The controller may be further configured to control the power supply to turn on each power line of the plurality of power lines for a same period of time.

The controller may be further configured to control the power supply to turn on the plurality of power lines at different times.

The controller may be further configured to: control the power supply to, based on a first power line among the plurality of power lines being turned off from an on-state, turn on a second power line among the plurality of power lines; and control the power supply to, based on the second power line being turned off, turn on the first power line.

The controller may be further configured to: control the power supply to, based on a first power line among the plurality of power lines being turned off from an on-state, turn on a second power line among the plurality of power lines: control the power supply to, based on the second power line among the plurality of power lines being turned off from an on-state, turn on a third power line among the plurality of power lines: control the power supply to, based on the third power line among the plurality of power lines being turned off from an on-state, turn on a fourth power line among the plurality of power lines; and control the power supply to, based on the fourth power line among the plurality of power lines being turned off from an on-state, turn on the first power line among the plurality of power lines.

The plurality of light emitting elements form a plurality of dimming blocks, each dimming block including a predetermined number of light emitting devices, and the plurality of power lines are configured to provide power to the plurality of dimming blocks.

The controller may be further configured to control the power supply such that a time for which each of the plurality of power lines remains turned off by a single turn-off is shorter than an afterimage perception time.

According to an aspect of the disclosure, there is provided a method of controlling a display apparatus including a substrate, a plurality of light emitting devices arranged in a two-dimensional (2D) matrix on the substrate, and a power supply including a plurality of power lines for providing power to the plurality of light emitting devices, the method including: controlling the power supply to turn on the plurality of power lines at different times; and controlling the power supply to turn on and off each power line of the plurality of power lines a plurality of number of times in one frame.

The method may include controlling the power supply to turn on each power line of the plurality of power lines for a same period of time.

The controlling of the power supply to turn the plurality of power lines on at different times may include: controlling the power supply to, based on a first power line among the plurality of power lines being turned off from an on-state, turn on a second power line among the plurality of power lines; and controlling the power supply to, based on the second power line being turned off, turn on the first power line.

The controlling of the power supply to turn the plurality of power lines on at different times may include: controlling the power supply to, based on a first power line among the plurality of power lines being turned off from an on-state, turn on a second power line among the plurality of power lines: controlling the power supply to, based on the second power line among the plurality of power lines being turned off from an on-state, turn on a third power line among the plurality of power lines: controlling the power supply to, based on the third power line among the plurality of power lines being turned off from an on-state, turn on a fourth power line among the plurality of power lines; and controlling the power supply to, based on the fourth power line among the plurality of power lines being turned off from an on-state, turn on the first power line among the plurality of power lines.

The plurality of light emitting elements may form a plurality of dimming blocks, each dimming block including a predetermined number of light emitting devices, and the plurality of power lines are configured to provide power to the plurality of dimming blocks.

The controlling of the power supply to turn on and off each of the plurality of power lines a plurality of times in one frame may include controlling the power supply such that a time for which each of the plurality of power lines remains turned off by a single-turn off is shorter than an afterimage perception time.

According to an aspect of the disclosure, there is provided a display apparatus including: a plurality of light emitting devices: a power supply including a plurality of power lines configured to apply power to the plurality of light emitting devices; and a controller configured to: control the power supply to turn on and off each power line of the plurality of power lines a plurality of times in one frame; and control the power supply to turn on each power line of the plurality of power lines for a same period of time.

The controller may be further configured to control the power supply to turn on the plurality of power lines at different times.

The controller may be further configured to: control the power supply to, based on a first power line among the plurality of power lines being turned off from an on-state, turn on a second power line among the plurality of power lines; and control the power supply to, based on the second power line being turned off, turn on the first power line.

The plurality of light emitting elements may form a plurality of dimming blocks, each dimming block including a predetermined number of light emitting devices, and the plurality of power lines are configured to provide power to the plurality of dimming blocks.

Provided are a display apparatus and a method for preventing a user from perceiving that the light emitting devices are turned off by repeatedly turning the power line on and off a plurality of number of times within one frame.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
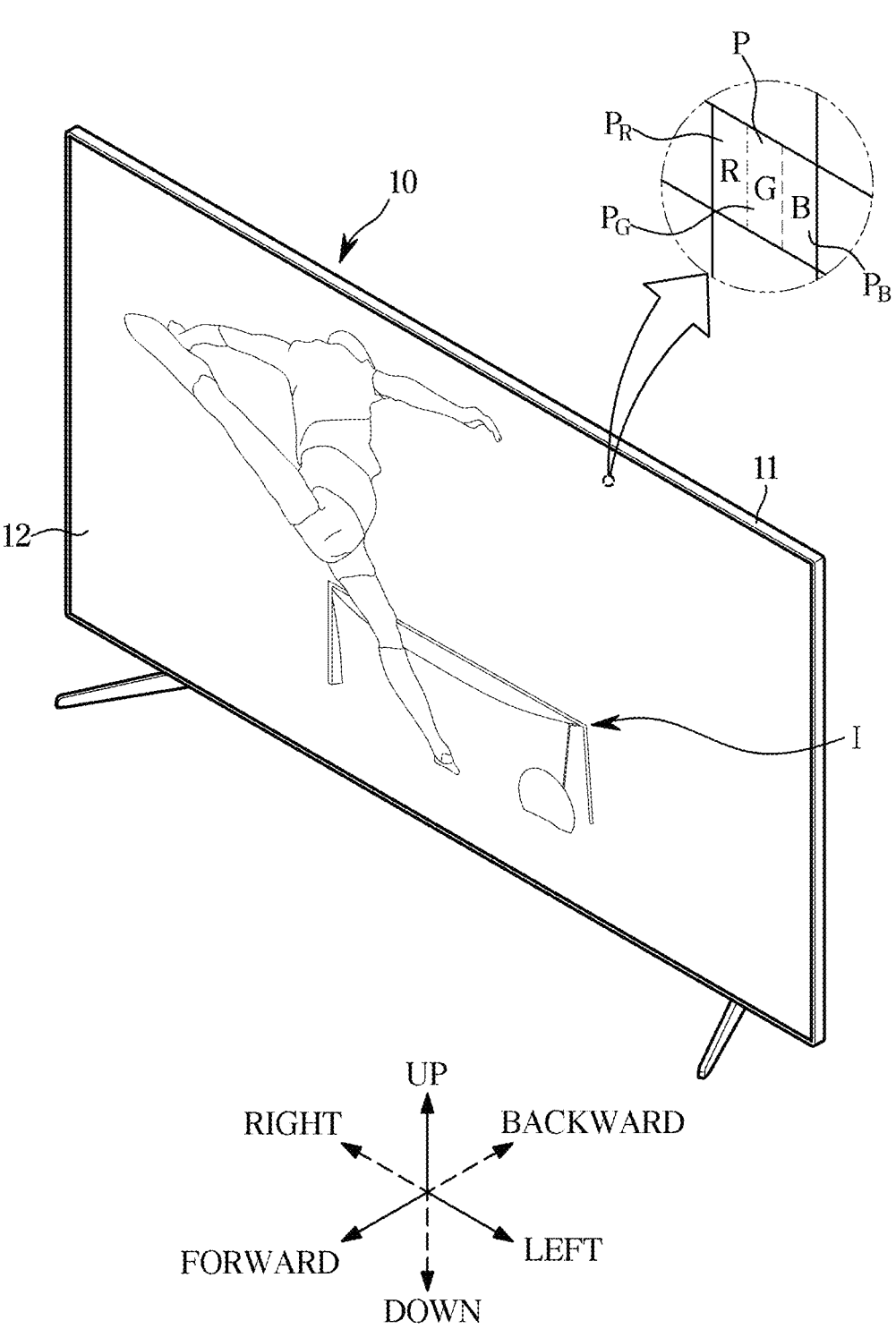
FIG. 1 illustrates an example of the external appearance of a display apparatus, according to an embodiment.

One or more embodiments described in the present disclosure and the configurations shown in the drawings are only examples of embodiments of the present disclosure, and various modifications may be made at the time of filing of the present disclosure to replace the embodiments and drawings of the present disclosure.

Further, identical symbols or numbers in the drawings of the disclosure denote components or elements configured to perform substantially identical functions.

The terms used herein are for the purpose of describing the embodiments and are not intended to restrict and/or to limit the present disclosure. For example, the singular expressions herein may include plural expressions, unless the context clearly dictates otherwise. In addition, the terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that when an element is referred to as being "connected," or "coupled," to another element, it can be directly connected or coupled to the other element or intervening elements may be present.

It will be understood that, although the terms "first", "second", etc. may be used herein to describe various components, these components should not be limited by these terms. These terms are only used to distinguish one component from another. For example, without departing from the scope of the present disclosure, the first component may be referred to as a second component, and similarly, the second component may in addition be referred to as a first component. The term "and/or" includes combinations of one or all of a plurality of associated listed items.

Hereinafter embodiments according to the present disclosure will be described with reference to the accompanying drawings.

FIG. 1 illustrates an example of the external appearance of a display apparatus according to an embodiment.

Referring to FIG. 1, a display apparatus 10 is a device that processes an image signal, which may be received from an external device or generated internally, and visually displays the processed image. Hereinafter the display apparatus 10 is described as a television, but the disclosure is not limited thereto. For example, the display apparatus 10 may be implemented in various forms, such as a monitor, a portable multimedia device, and a portable communication device, and the display apparatus 10 is not limited in its shape.

In addition, the display apparatus 10 may be a large format display (LFD) installed outdoors, such as a roof of a building, a bus stop or other outdoor location. The LFD may also be installed indoors, such as in subway stations, shopping malls, movie theaters, companies, stores or other indoor locations.

The display apparatus 10 may receive content including a video signal and an audio signal from various content sources and output video and audio corresponding to the video signal and the audio signal. For example, the display apparatus 10 may receive content data through a broadcast reception antenna or cable, receive content data from a content playback device, or receive content data from a content providing server of a content provider.

Referring to FIG. 1, the display apparatus 10 includes a body 11, and a screen 12 provided to display an image I.

The body 11 may form an appearance of the display apparatus 10, and the body 11 may include a component configured to allow the display apparatus 10 to display the image I and to perform various functions. Although the body 11 shown in FIG. 1 is in the form of a flat plate, the shape of the body 11 is not limited thereto. For example, the body 11 may have a curved plate shape.

The screen 12 may be formed on a front surface of the body 11, and be configured to display the image I. For example, the screen 12 may display a still image or a moving image. Further, the screen 12 may display a two-dimensional plane image or a three-dimensional image using binocular parallax of the user.

The screen 12 may include a liquid crystal panel for selectively passing or blocking light emitted by a backlight unit (BLU) (e.g., a backlight) or the like.

The screen 12 may include a self-emissive display (for example, a light emitting diode panel or an organic light emitting diode panel) configured to emit light directly or a non-emissive display (for example, a liquid crystal panel) configured to transmit or block light emitted from a light source apparatus (for example, a backlight unit).

A plurality of pixels P may be formed on the screen 12 and the image I displayed on the screen 12 may be formed by a combination of the light emitted from the plurality of pixels P. For example, the image I may be formed on the screen 12 by combining light emitted from the plurality of pixels P as a mosaic.

Each of the plurality of pixels P may emit a different brightness and a different color of light. In order to emit light in the various colors, the plurality of pixels P may include sub-pixels PR, PG, and PB, respectively.

The sub-pixels PR, PG, and PB may include a red sub pixel PR configured to emit red light, a green sub pixel PG configured to emit green light, and a blue sub pixel PB configured to emit blue light. For example, the red light may represent a light beam having a wavelength of approximately 700 nm (nanometers, one billionth of a meter) to 800 nm, the green light may represent a light beam having a wavelength of approximately 500 nm to 600 nm, and the blue light may represent a light beam having a wavelength of approximately 400 nm to 500 nm.

By combining the red light of the red sub pixel PR, the green light of the green sub pixel PG and the blue light of the blue sub pixel PB, each of the plurality of pixels P may emit a different brightness and a different color of light.

Figure 2:
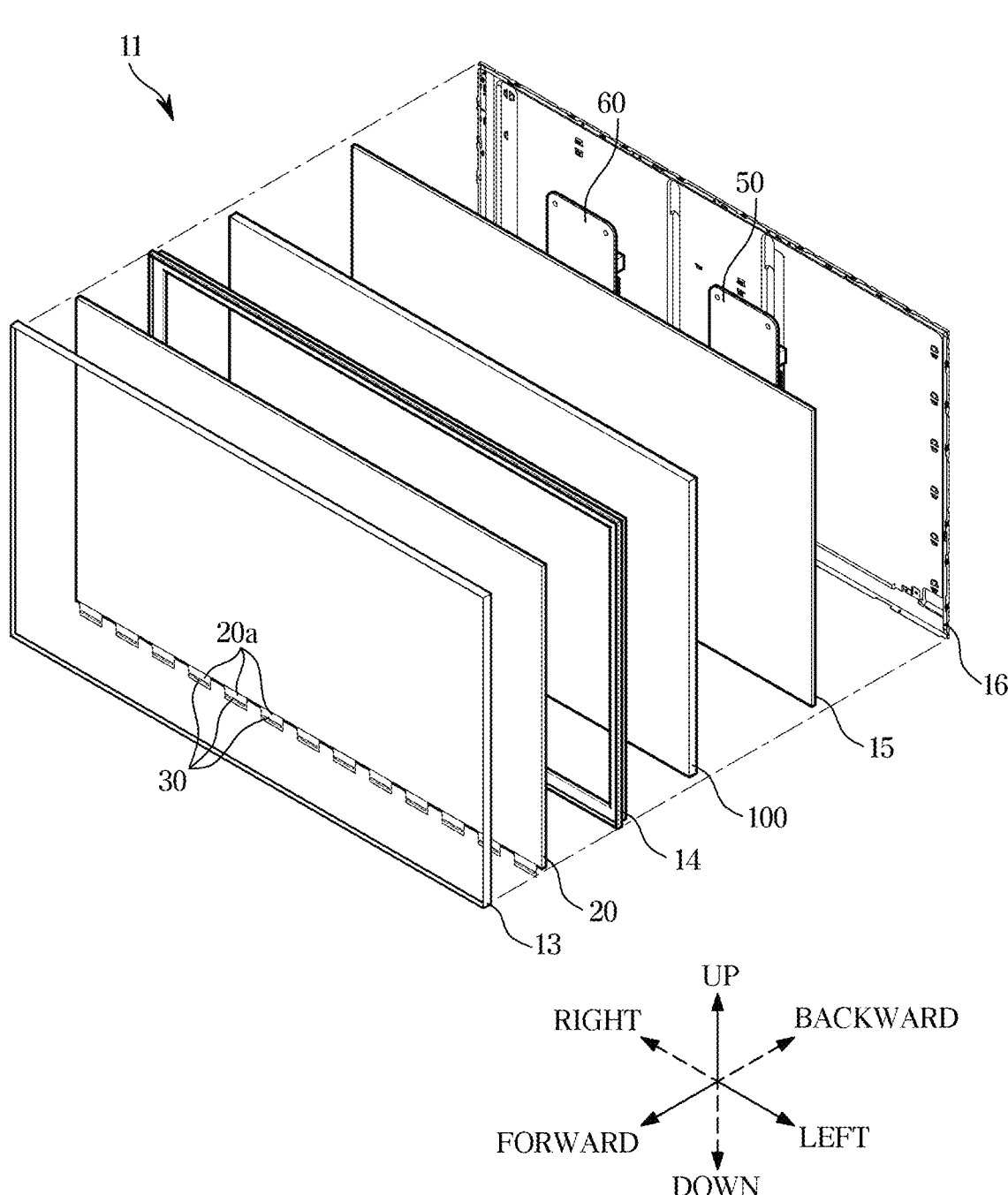
FIG. 2 illustrates an example of the structure of a display apparatus, according to an embodiment.

FIG. 2 illustrates an example of a structure of the display apparatus 10 according to an embodiment Referring to FIG. 2, various components configured to generate the image I on the screen S may be provided inside the body 11.

For example, the body 11 may include a backlight unit 100 that is a surface light emitting device (a surface light source), a liquid crystal panel 20 configured to block or transmit light emitted from the backlight unit 100, a control assembly 50 configured to control an operation of the backlight unit 100 and the liquid crystal panel 20, and a power assembly 60 configured to supply power to the backlight unit 100 and the liquid crystal panel 20. Further, the body 11 may include a bezel 13, a frame middle mold 14, a bottom chassis 15 and a rear cover 16 which are provided to support the liquid crystal panel 20, the backlight unit 100, the control assembly 50 and the power assembly 60.

The backlight unit 100 may include a point light emitting device configured to emit light, for example, white light. The backlight unit 100 may refract, reflect, and scatter light emitted from the point light emitting device so as to convert the light emitted from the point light emitting device to surface light. As described above, the backlight unit 100 may refract, reflect, and scatter light emitted from the point light emitting device, thereby emitting uniform surface light toward the liquid crystal panel 20.

A configuration of the backlight unit 100 will be described in more detail below.

The liquid crystal panel 20 is provided in front of the backlight unit 100 and selectively blocks or transmits light emitted from the backlight unit 100 to form the image I.

A front surface of the liquid crystal panel 20 may form the screen S of the display apparatus 10 described above, and the liquid crystal panel 20 may form the plurality of pixels P. In the liquid crystal panel 20, the plurality of pixels P may independently block or transmit light from the backlight unit 100. The light transmitted through the plurality of pixels P may form the image I displayed on the screen S.

Figure 3:
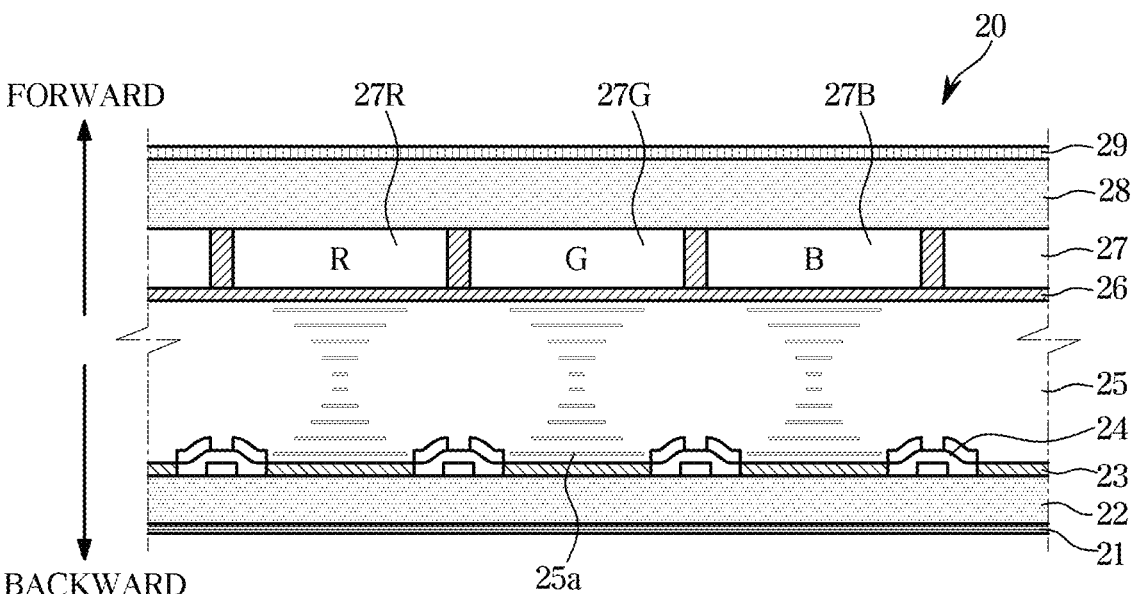
FIG. 3 illustrates an example of a liquid crystal panel included in a display apparatus, according to an embodiment.

FIG. 3 illustrates an example of a liquid crystal panel included in the display apparatus 10 according to an embodiment.

For example, as shown in FIG. 3, the liquid crystal panel 20 may include a first polarizing film 21, a first transparent substrate 22, a pixel electrode 23, a thin film transistor 24, a liquid crystal layer 25 with liquid crystals 25*a*, a common electrode 26, a color filter 27 (e.g., 27R, 27B, 27G), a second transparent substrate 28, and a second polarizing film 29.

Figure 4:
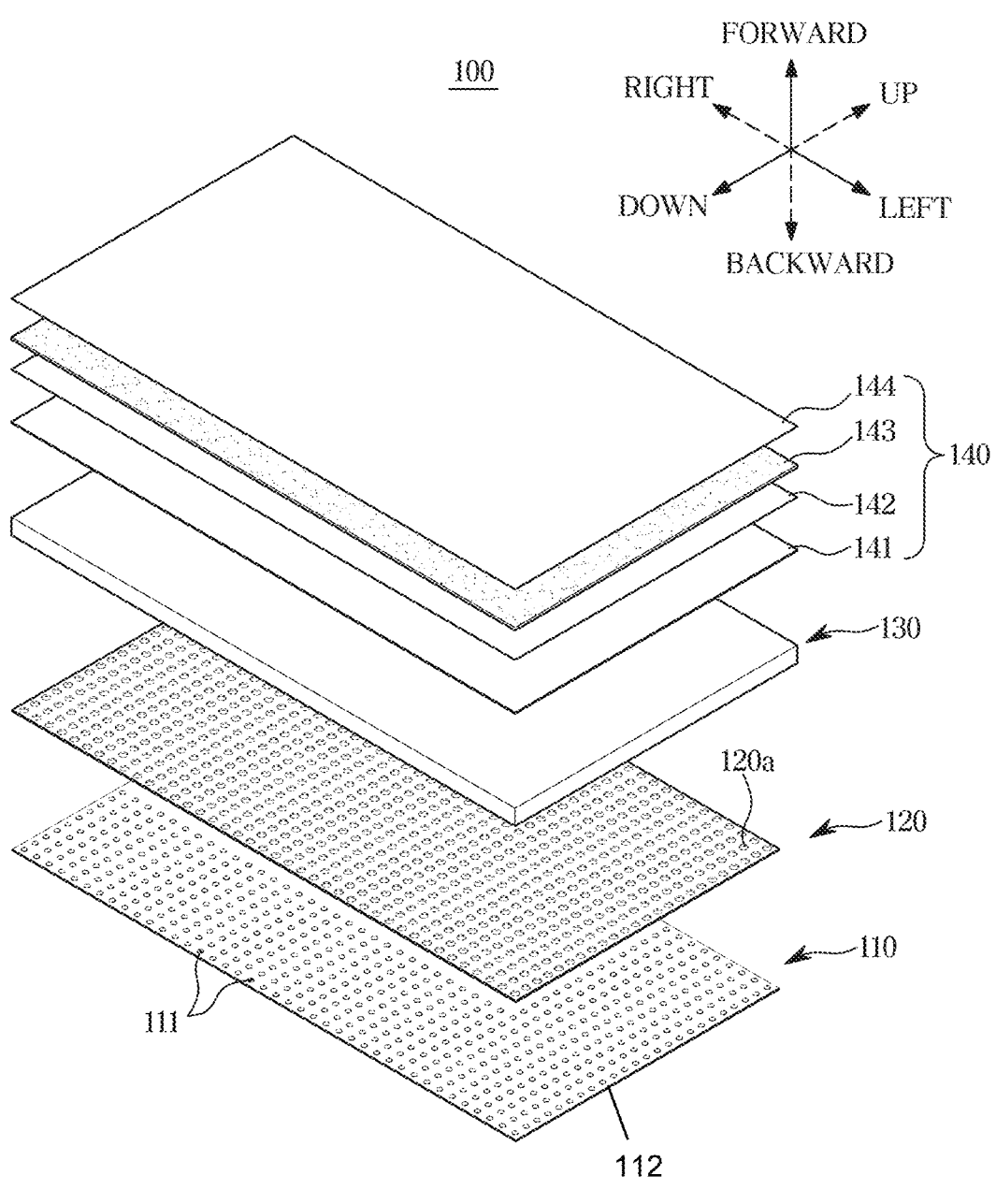
FIG. 4 illustrates an example of a back light unit (BLU) included in a display apparatus, according to an embodiment.
Figure 5:
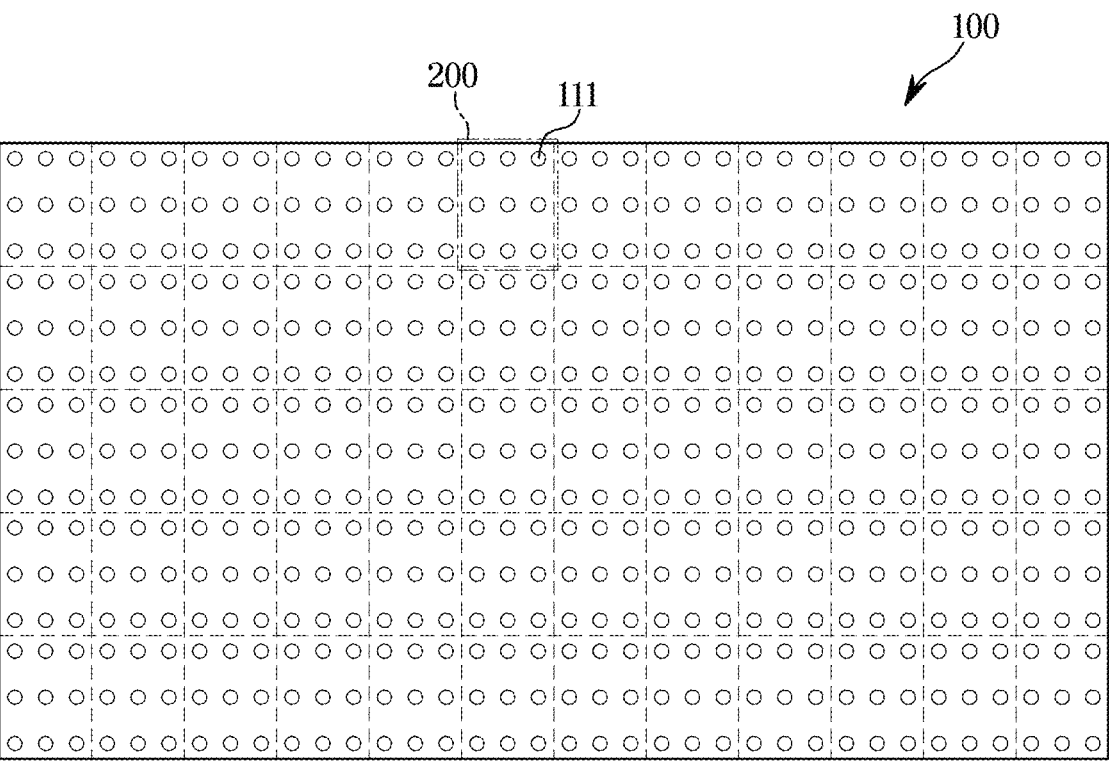
FIG. 5 is a diagram for describing a plurality of light emitting diodes of a back light unit according to an embodiment, which are divided into dimming blocks.

FIG. 4 illustrates an example of a back light unit (BLU) 100 included in the display apparatus 10 according to an embodiment, and FIG. 5 is a diagram for describing a plurality of light emitting diodes of a back light unit 100 according to an embodiment, which are divided into dimming blocks.

Referring to FIG. 4, the backlight unit 100 may include a light source module 110 configured to generate light, a reflective sheet 120 configured to reflect light, a diffuser plate 130 configured to uniformly diffuse light, and an optical sheet 140 configured to improve a luminance of light that is emitted.

The light source module 110 may include a plurality of light emitting devices 111 configured to emit light, and a substrate 112 provided to support/fix the plurality of light emitting devices 111.

The plurality of light emitting devices 111 may be disposed in a predetermined pattern to allow light to be emitted with uniform luminance. The plurality of light emitting devices 111 may be disposed in such a way that a distance between one light source and light sources adjacent thereto is the same.

For example, as shown in FIG. 4, the plurality of light emitting devices 111 may be arranged in rows and columns. For example, the plurality of light sources may be disposed such that an approximate square is formed by four adjacent light sources. In addition, any one light source may be disposed adjacent to four light sources, and a distance between one light source and four adjacent light sources may be approximately the same.

Alternatively, according to embodiments, the plurality of light sources may be disposed such that an approximately equilateral triangle is formed by three adjacent light sources. In this case, one light source may be disposed adjacent to six light sources, and a distance between one light source and six adjacent light sources may be approximately the same.

However, the pattern in which the plurality of light emitting devices 111 is disposed is not limited to the patterns described above, and the plurality of light emitting devices 111 may be disposed in various patterns to allow light to be emitted with uniform luminance.

The light emitting device 111 may include an element configured to emit monochromatic light (i.e., light of a specific wavelength, for example, blue light) or white light (for example light of a mixture of red light, green light, and blue light) in various directions by receiving power. For example, the plurality of light emitting devices 111 may each include a light emitting diode (LED). The LEDs may be implemented in various sizes, and may include, for example, Mini LEDs and/or Micro LEDs.

The substrate 112 may fix the plurality of light emitting devices 111 to prevent a change in the position of the light emitting device 111. Further, the substrate 112 may supply power, which is used by the light emitting device 111 to emit light, to the light emitting device 111.

The substrate 112 may fix the plurality of light emitting devices 111, and may include synthetic resin and/or tempered glass and/or a printed circuit board (PCB) on which a conductive power supply line for supplying power to the light emitting device 111 is formed.

The reflective sheet 120 may reflect light emitted from the plurality of light emitting devices 111 to a front side or to a direction close to the front side.

In the reflective sheet 120, a plurality of through holes 120a is formed at positions corresponding to each of the plurality of light emitting devices 111 of the light source module 110. In addition, the light emitting device 111 of the light source module 110 may extend into the through hole 120a, and may pass through the through hole 120a and protrude to the front of the reflective sheet 120.

For example, during a process of assembling the reflective sheet 120 and the light source module 110, the plurality of light emitting devices 111 of the light source module 110 may be inserted into the plurality of through holes 120a formed in the reflective sheet 120.

Accordingly, the substrate 112 of the light source module 110 may be positioned behind the reflective sheet 120

The plurality of light emitting devices 111 may emit light in various directions from the front of the reflective sheet 120. Light may not only be emitted from the light emitting device 111 toward the diffuser plate 130, but also may be emitted from the light emitting device 111 toward the reflective sheet 120, and the reflective sheet 120 may allow light emitted toward the reflective sheet 120 to be reflected toward the diffuser plate 130.

Light emitted from the light emitting device 111 passes through various objects, such as the diffuser plate 130 and the optical sheet 140. When light passes through the diffuser plate 130 and the optical sheet 140, some of the incident light is reflected from the surfaces of the diffuser plate 130 and the optical sheet 140. The reflective sheet 120 may reflect the light reflected by the diffuser plate 130 and the optical sheet 140.

The diffuser plate 130 may be provided in front of the light source module 110 and the reflective sheet 120, and may evenly distribute the light emitted from the light emitting device 111 of the light source module 110.

As described above, the plurality of light emitting devices 111 are located at various positions on the rear surface of the backlight unit 100. Although the plurality of light emitting devices 111 are disposed at equal intervals on the rear surface of the backlight unit 100, unevenness in luminance may occur depending on the positions of the plurality of light emitting devices 111.

The diffuser plate 130 may allow light emitted from the plurality of light emitting devices 111 to be diffused inside the diffuser plate 130 to remove unevenness in luminance caused by the plurality of light emitting devices 111. In this regard, the diffuser plate 130 may uniformly emit uneven light of the plurality of light emitting devices 111 to the front surface.

The optical sheet 140 may include various sheets for improving luminance and luminance uniformity. For example, the optical sheet 140 may include a diffusion sheet 141, a first prism sheet 142, a second prism sheet 143, and a reflective polarizing sheet 144.

The diffusion sheet 141 diffuses light to improve uniformity of luminance. Light emitted from the light emitting device 111 may be diffused by the diffuser plate 130 and diffused again by the diffusion sheet 141 included in the optical sheet 140.

The first and second prism sheets 142 and 143 may increase luminance by condensing the light diffused by the diffusion sheet 141. The first and second prism sheets 142 and 143 include a prism pattern having a triangular prism shape, and a plurality of the prism patterns are arranged adjacent to each other, forming a plurality of band shapes.

The reflective polarizing sheet 144 is a type of polarizing film and may transmit some of the incident light and reflect another portion of the incident light to improve luminance. For example, light polarized in the same direction as a predetermined polarization direction of the reflective polarizing sheet 144 may be transmitted, and light polarized in a direction different from that of the reflective polarizing sheet 144 may be reflected. In addition, the light reflected by the reflective polarizing sheet 144 may be recycled inside the backlight unit 100, and such a light recycling may allow the luminance of the display apparatus 10 to be improved.

The sheet of film included in the optical sheet 140 is not limited to the sheet or film shown in FIG. 4, and the optical sheet 140 may include different sheets, such as a protective sheet, or films.

The backlight unit 100 may include a plurality of light emitting devices 111 and may diffuse light emitted from the plurality of light emitting devices 111, thereby outputting surface light. The liquid crystal panel 20 may include a plurality of pixels, and may control the plurality of pixels to allow the plurality of pixels to transmit or block light. An image may be formed by light that passes through each of the plurality of pixels.

In this case, in order to improve power consumption while increasing the contrast ratio, the display apparatus 10 may perform local dimming to vary the brightness of light for each region of the backlight unit 100 in association with the output image.

For example, in order to darken a dark area of an image, the display apparatus 10 may decrease the brightness of light from the light emitting device 111 of the backlight unit 100 corresponding to the dark area of the image, and in order to brighten a bright area of an image, may increase the brightness of light from the light emitting device 111 of the backlight unit 100 corresponding to the bright area of the image. Accordingly, the contrast ratio of an image may be improved.

The display apparatus 10 may divide the backlight unit 100 into a plurality of blocks, and independently control a current for each block according to an input image. Image transmission of the display apparatus 10 may be achieved by performing local dimming driving for each frame, and driving of a current is adjusted according to the number of blocks into which light emitting devices 111 are divided in the backlight unit 100.

As a result, the display apparatus 10 may decrease a current supplied to a dimming block in a dark area of an input image and increase a current supplied to a dimming block in a bright area of the input image such that the contrast ratio may be effectively improved.

For local dimming, the plurality of light emitting devices 111 included in the backlight unit 100 may be divided into a plurality of dimming blocks 200. For example, as shown in FIG. 5, the plurality of dimming blocks 200 may include a total of 60 dimming blocks 200, arranged in five rows and twelve columns. However, the number of dimming blocks 200 and arrangement thereof is not limited to those shown in FIG. 5.

Referring to FIG. 5, each of the plurality of dimming blocks 200 may include at least one light emitting device 111. The backlight unit 100 may supply the same driving current to light emitting devices 111 belonging to the same dimming block 200, and the light emitting devices 111 belonging to the same dimming block 200 may emit light of the same brightness.

In addition, the backlight unit 100 may supply different drive currents to light emitting devices 111 belonging to different dimming blocks 200 according to dimming data, and the light emitting devices 111 belonging to the different dimming blocks 200 may emit light of different brightness.

Each of the plurality of dimming blocks 200 may include, for example, N×M light sources arranged in an N×M-matrix form (N and M are natural numbers). An N×M matrix refers to a matrix with N rows and M columns.

Because each of the light emitting devices 111 includes an LED, each of the plurality of dimming blocks 200 may include N×M LEDs.

The plurality of dimming blocks 200 may be disposed on the substrate 112. That is, N×M LEDs may be disposed on the substrate 112.

Figure 6:
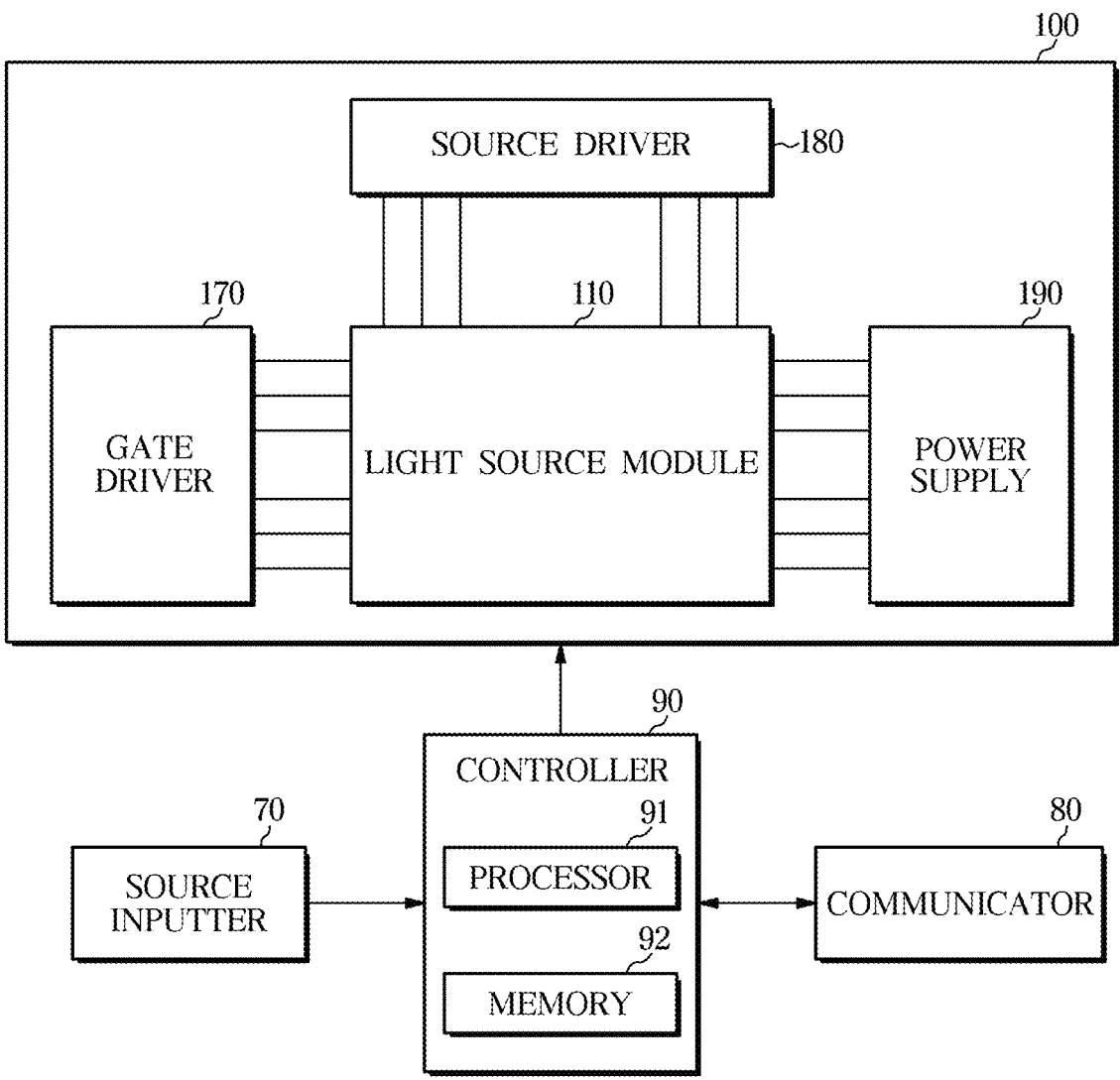
FIG. 6 is a control block diagram of a display apparatus according to an embodiment.

FIG. 6 is a control block diagram of a display apparatus according to an embodiment.

The display apparatus 10 may include a controller 90, a processor 91, a memory 92, a communicator 80, a source inputter 70, and a backlight unit 100, and the backlight unit 100 may include a source driver 180, a gate driver 170, a power supply 190, and a light source module 110.

A panel driver is configured to drive the panel of the liquid crystal display apparatus, and may include the gate driver 170 that provides a gate signal to a gate line and the source driver 180 that provides a data signal to a data line. As an example, the gate driver 170 and the source driver 180 may be implemented as a display driver integrated circuit (DDI).

The source driver 180 may convert image data into an analog voltage and supply the analog voltage to a source line, and the gate driver 170 may supply an analog voltage pulse waveform to a gate line according to a control signal.

The controller 90 may control the source driver 180 and the gate driver 170 such that the image data is supplied to the gate line.

In addition, the controller 90 may control the power supply 190 such that power is supplied to a plurality of light emitting devices 111 connected to power lines.

In addition, the display apparatus 10 may further include a communicator 80 that performs wireless communication with an external electronic device. The communicator 80 may include at least one communication module that transmits and receives data according to a predetermined communication protocol. For example, the communicator 80 may include at least one of various wireless communication modules that may be wirelessly connected to the Internet, such as a Wifi module, a wireless broadband module (Wibro) module, a global system for mobile communication (GSM) module, a code division multiple access (CDMA) module, a wideband code division multiple access (WCDMA) module, a universal mobile telecommunications system (UMTS) module, a time division multiple access (TDMA) module, a long term evolution (LTE) module, a 4th generation (4G) mobile communication module, and a 5th generation (5G) mobile communication, and the like. In addition, the communicator 80 may include a short-range wireless communication module, such as a Bluetooth module or Wi-Fi Direct module.

The communicator 80 performs operations such as communicating with a central server that controls the display apparatus 10, retrieving information needed by a user from an external server, or transmitting information entered by a user to an external server.

The source inputter 70 may receive source signals input from a set-top box, a universal serial bus (USB), an antenna, and the like. Accordingly, the source inputter 70 may include at least one selected from a source input interface group including a high definition multimedia interface (HDMI) cable port, a USB port, an antenna, and the like.

In the above, a process of the controller 90 controlling a driver IC (not shown) and the power supply 190 to adjust the driving of the light emitting device 111 has been described. Hereinafter, a connecting relationship between elements and a method of driving the light emitting device 111 will be described with reference to drawings, which illustrate the arrangement of elements in a circuit.

Figure 7:
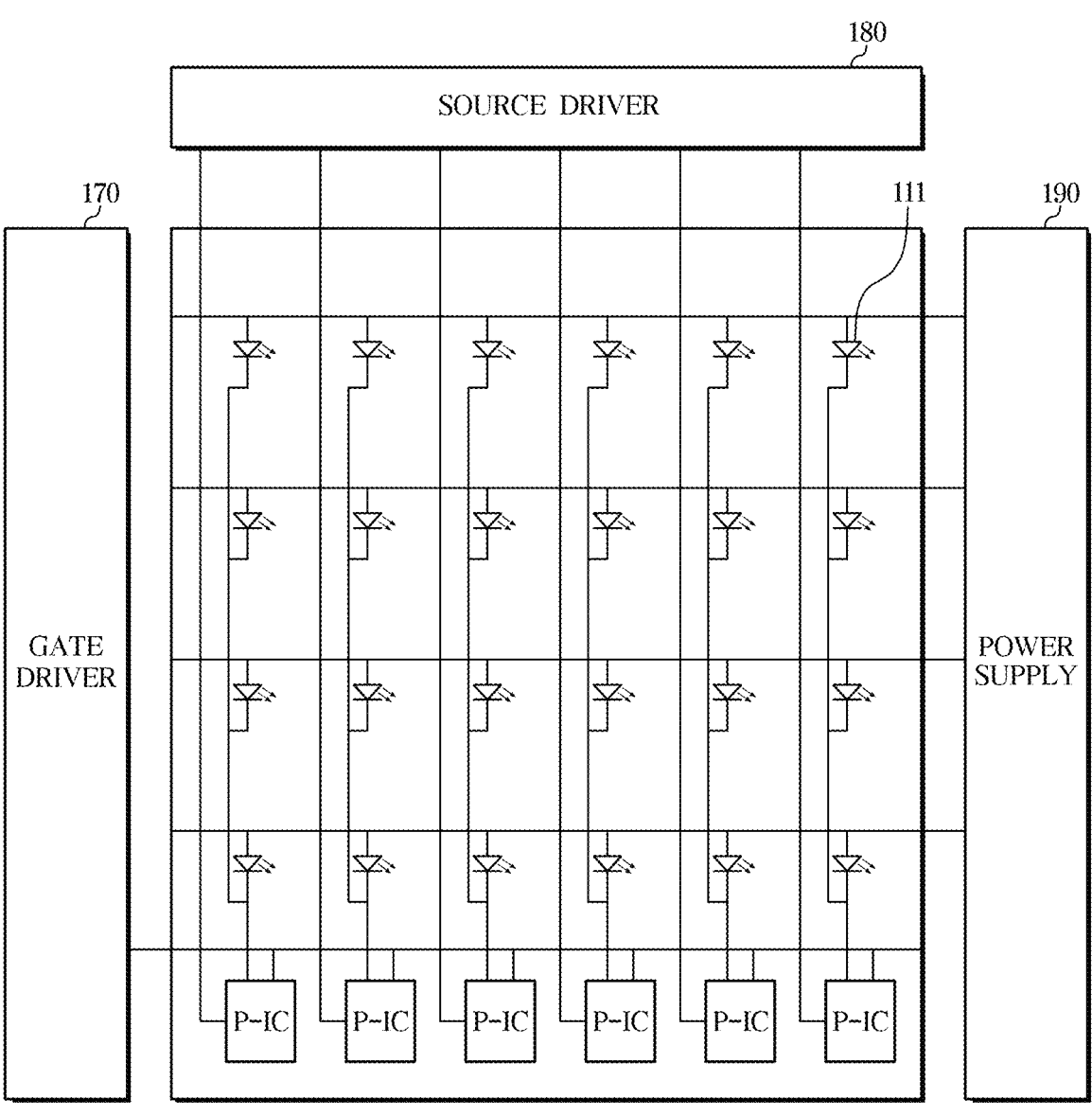
FIG. 7 illustrates a connection structure of a driver, a light emitting device, and a power supply of a backlight unit, according to an embodiment.
Figure 8:
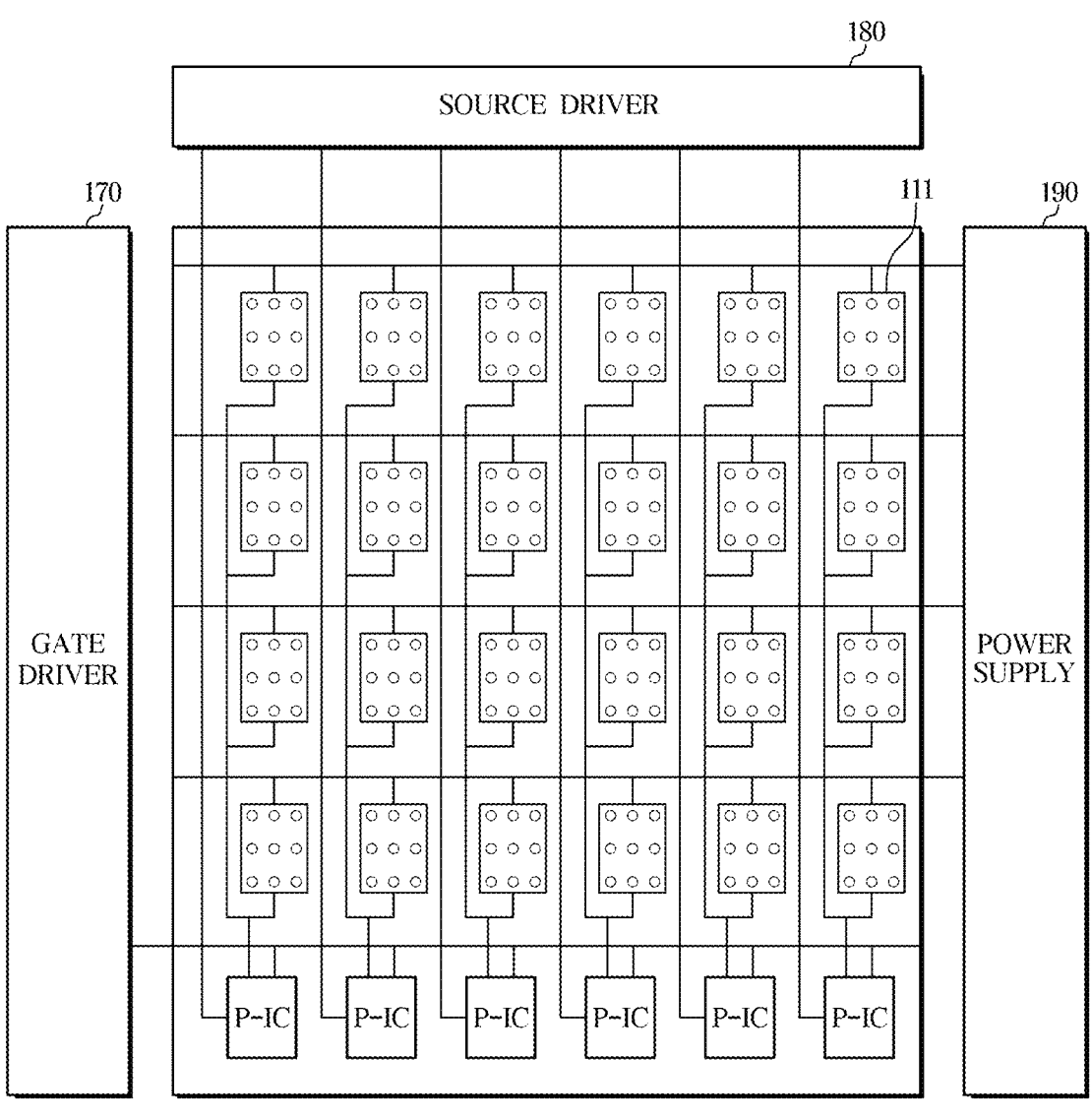
FIG. 8 is a diagram illustrating an example in which the light emitting device of FIG. 7 corresponds to a dimming block, according to an embodiment.

FIG. 7 illustrates a connection structure of a driver, a light emitting device, and a power supply of a backlight unit according to an embodiment. FIG. 8 is a diagram illustrating an example in which the light emitting device shown in FIG. 7 corresponds to a dimming block.

Referring to FIG. 7, a plurality of light emitting devices 111 arranged in the form of a two-dimensional (2D) matrix on a substrate may be connected to gate lines and source lines, and the source driver 180 may convert image data into an analog voltage and supply the analog voltage to the source lines, and the gate driver 170 may supply an analog voltage pulse waveform to the gate lines according to a control signal.

In addition, the plurality of light emitting devices 111 may be connected to a plurality of power lines included in the power supply 190 and receive power from the plurality of power lines.

The plurality of light emitting devices 111 may form a plurality of dimming blocks 200 each including a predetermined number of light emitting devices 111.

That is, as shown in FIG. 8, nine light emitting devices 111 may form one dimming block 200, and each of the dimming blocks 200 may be connected to a power line and may receive power from the power line.

The light emitting devices 111 are illustrated as nine light emitting devices 111 in FIG. 8, but this is for illustrative purpose only, and there is no limit to the number of light emitting devices 111 forming the dimming block 200.

The controller 90 may, when applying power to the plurality of light emitting devices 111, perform time division control, which will be described below.

Figure 9:
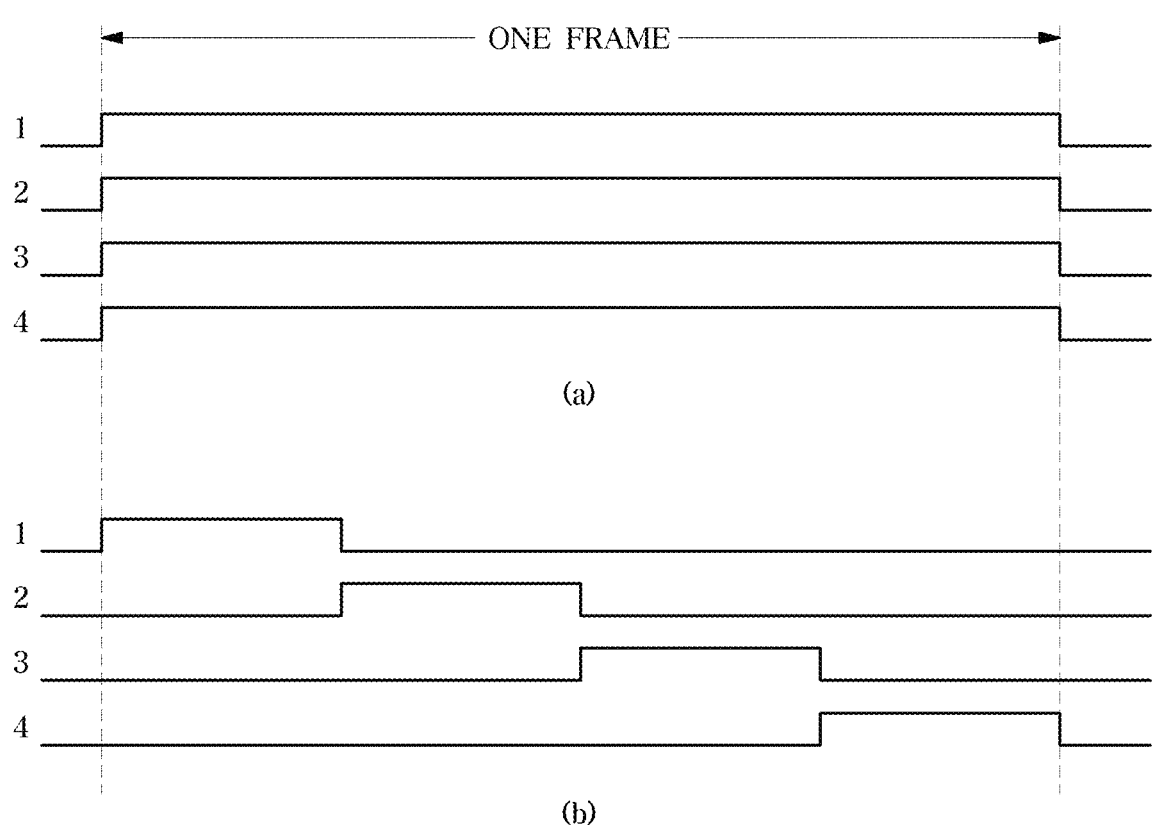
FIG. 9 is a diagram for describing time division driving, according to an embodiment.
Figure 10:
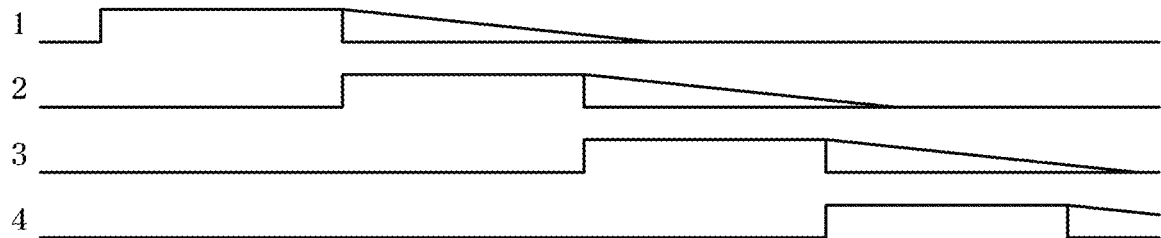
FIG. 10 is a diagram for describing an afterimage perception of a human according to time-division driving, according to an embodiment.

FIG. 9(*a*) is a diagram for describing time division driving according to an embodiment, FIG. 9(*b*) is a diagram for describing time division driving according to an embodiment, and FIG. 10 is a diagram for describing an afterimage perception of a human according to time-division driving according to an embodiment.

Hereinafter, an example in which the power lines are provided as four power lines is described, but this is only an example and there is no limit to the number of power lines.

In the conventional technology, driving of the light emitting devices 111 is performed such that the light emitting devices 111 connected to the first to fourth power lines are always turned on.

However, such a driving is inefficient, and time-division driving is performed to reduce the number of chips controlling the power lines.

That is, driving is performed by driving on-times such that the first to fourth power lines are turned on at different times within a unit frame, thereby reducing the time for which each of the light emitting device 111 is turned on, and also reducing the number of chips.

However, when time division control is performed, the time for which the light emitting devices 111 of each power line is turned off becomes longer than an afterimage perception time of a human, and thus it may be perceived that the light emitting devices 111 are turned off.

Referring to FIG. 10, when the first power line is turned off, an afterimage may be perceived for a certain period of time after the turn-off. However, since the first power line remains turned off even after the afterimage perception time has elapsed, it may be perceived that the light emitting device 111 is turned off.

In order to resolve the issue, the disclosure may be implemented to repeat turning on and off each power line a plurality of times within a unit frame to provide a user with a perception as if the light emitting devices 111 are not turned off.

Figure 11:
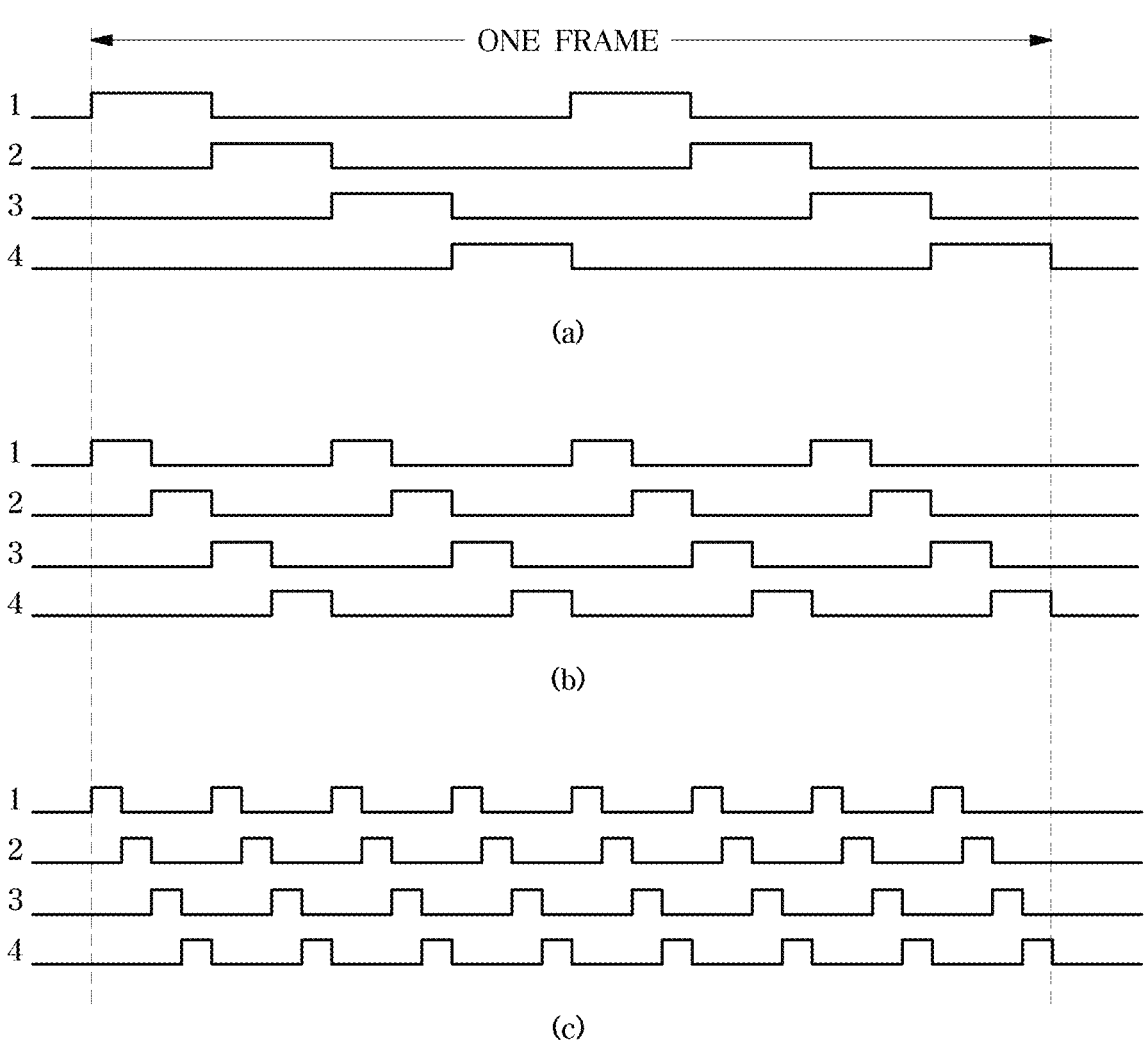
FIG. 11 is a diagram illustrating distribution of on-times in time-division driving, according to an embodiment.
Figure 12:
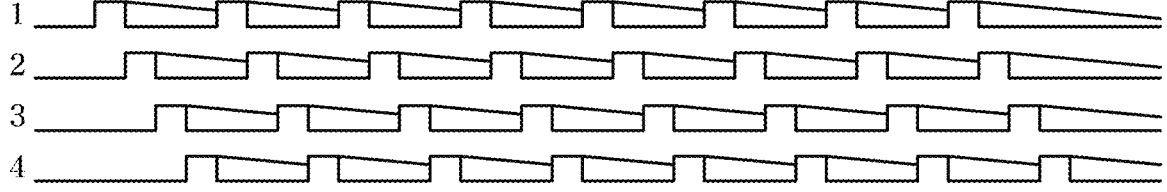
FIG. 12 is a diagram illustrating an afterimage perception of a human, according to distribution of on-times shown in FIG. 11, according to an embodiment.

FIG. 11(*a*) is a diagram illustrating distribution of on-times in a time division drive according to an embodiment, FIG. 11(*b*) is a diagram illustrating distribution of on-times in time division drive according to an embodiment, and FIG. 11(*c*) is a diagram illustrating distribution of on-times in time division drive according to an embodiment. FIG. 12 is a diagram illustrating an afterimage perception of a human according to distribution of on-times shown in FIG. 11.

The controller 90 may control the power supply 190 such that each of the plurality of power lines is turned on and off a plurality of times in a unit frame, for example, one frame.

FIG. 11(*a*) illustrates an example in which each of the plurality of power lines is controlled to turn on and off twice within one frame, and FIG. 11(*b*) illustrates an example in which each of the plurality of power lines is controlled to be turned on and off four times within one frame, and FIG. 11(*c*) illustrates an example in which each of the plurality of power lines is controlled to be turned on and off eight times within one frame. The number of times each of the plurality of power lines is turned on and off is not limited thereto, and may be implemented as various embodiments.

The controller 90 may control the power supply 190 such that each of the plurality of power lines remains turned on for the same period of time.

For example, the first power line may be turned on for a first period of time, and in response to the first power line being turned off, the controller 90 may control the second power line to be turned on for the same period of time, that is, the first period of time.

In addition, the controller 90 may control the power supply 190 such that a plurality of power lines are turned on at different times.

The disclosure is implemented to distribute on-times of the power lines in the existing time division driving, and the on-times of the power lines may be controlled not to overlap each other.

For example, when two power lines are present, the controller 90 may, in response to the first power line being turned off from an on-state, control the power supply 190 such that the second power line is turned on, and in response to the second power line being turned off, control the power supply 190 such that the first power line is turned on.

In addition, when four power lines are present, the controller 90 may, in response to the first power line being turned off from an on-state, control the power supply 190 such that the second power line is turned on, and in response to the second power line being turned off, control the power supply 190 such that the third power line is turned on, and in response to the third power line being turned off, control the power supply 190 such that the fourth power line is turned on, and in response to the fourth power line being turned off, control the power supply 190 such that the first power line is turned on.

As described above, the time division driving may be efficiently performed by controlling one of the power lines to be turned on in response to another one of the power lines being turned off, and allowing each of the power lines to remain turned on for the same period of time.

Compared to FIG. 9(*b*) it can be seen that, while maintaining the total period of time that each of the power lines remains turned on within one frame, the disclosure may prevent a perception that the light emitting devices 111 are turned off. That is, as shown in FIG. 12, the controller 90 may control the power supply 190 such that the time for which each of the plurality of power lines remains turned off by a single turn-off is shorter than an afterimage perception time.

A display apparatus according to an embodiment includes: a substrate: a plurality of light emitting devices arranged in a form of a two-dimensional (2D) matrix on the substrate: a power supply including a plurality of power lines configured to apply power to the plurality of light emitting devices; and a controller configured to control the power supply such that each of the plurality of power lines is turned on and off a plurality of number of times in one frame.

The controller may be configured to control the power supply such that each of the plurality of power lines remains turned on for a same period of time.

The controller may be configured to control the power supply such that the plurality of power lines may be turned on at different times.

The controller may be configured to: control the power supply such that in response to a first power line among the plurality of power lines being turned off from an on-state, a second power line among the plurality of power lines may be turned on; and control the power unit such that in response to the second power line being turned off, the first power line may be turned on.

The controller may be configured to: control the power supply such that in response to a first power line among the plurality of power lines being turned off from an on-state, a second power line among the plurality of power lines is turned on: control the power supply such that in response to the second power line among the plurality of power lines being turned off from an on-state, a third power line among the plurality of power lines is turned on; control the power supply such that in response to the third power line among the plurality of power lines being turned off from an on-state, a fourth power line among the plurality of power lines is turned on; and control the power supply such that in response to the fourth power line among the plurality of power lines being turned off from an on-state, the first power line among the plurality of power lines is turned on.

The plurality of light emitting elements may form a plurality of dimming blocks, each including a predetermined number of light emitting devices, and the plurality of power lines may be configured to apply power to the plurality of dimming blocks.

The controller may be configured to control the power supply such that a time for which each of the plurality of power lines remains turned off by a single turn-off may be shorter than an afterimage perception time.

A method of controlling a display apparatus including a substrate, a plurality of light emitting devices arranged in a form of a two-dimensional (2D) matrix on the substrate, and a power supply including a plurality of power lines configured to apply power to the plurality of light emitting devices according to an embodiment, includes: controlling the power supply such that the plurality of power lines are turned on at different times; and controlling the power supply such that each of the plurality of power lines is turned on and off a plurality of times in one frame.

The method may further include controlling the power supply such that each of the plurality of power lines remains turned on for a same period of time.

The controlling of the power supply such that the plurality of power lines are turned on at different times may include: controlling the power supply such that in response to a first power line among the plurality of power lines being turned off from an on-state, a second power line among the plurality of power lines is turned on; and controlling the power unit such that in response to the second power line being turned off, the first power line is turned on.

The controlling of the power supply such that the plurality of power lines are turned on at different times may include: controlling the power supply such that in response to a first power line among the plurality of power lines being turned off from an on-state, a second power line among the plurality of power lines is turned on: controlling the power supply such that in response to the second power line among the plurality of power lines being turned off from an on-state, a third power line among the plurality of power lines is turned on: controlling the power supply such that in response to the third power line among the plurality of power lines being turned off from an on-state, a fourth power line among the plurality of power lines is turned on; and controlling the power supply such that in response to the fourth power line among the plurality of power lines being turned off from an on-state, the first power line among the plurality of power lines is turned on.

The plurality of light emitting elements may form a plurality of dimming blocks, each including a predetermined number of light emitting devices, and the plurality of power lines may be configured to apply power to the plurality of dimming blocks.

The controlling of the power supply such that each of the plurality of power lines is turned on and off a plurality of number of times in one frame may include controlling the power supply such that a time for which each of the plurality of power lines remains turned off by a single-turn off is shorter than an afterimage perception time.

According to the disclosure, it is possible to prevent a user from perceiving that the light emitting devices are turned off by repeatedly turning the power line on and off a plurality of times within one frame.

The disclosed embodiments may be embodied in the form of a recording medium storing instructions executable by a computer. The instructions may be stored in the form of program code and, when executed by a processor, may generate a program module to perform the operations of the disclosed embodiments. The recording medium may be embodied as a computer-readable recording medium.

The computer-readable recording medium includes all kinds of recording media in which instructions which may be decoded by a computer are stored, for example, on a Read Only Memory (ROM), a Random Access Memory (RAM), a magnetic tape, a magnetic disk, a flash memory, an optical data storage device, and the like.

Although certain embodiments of the disclosure have been described with reference to the accompanying drawings, a person having ordinary skill in the art will appreciate that modifications may be made thereto without departing from the technical spirit or essential features of the disclosure. Therefore, the foregoing embodiments should be regarded as illustrative rather than limiting in all aspects.

What is claimed is:

1. A display apparatus comprising:
a substrate;
a plurality of light emitting devices arranged in a two-dimensional (2D) matrix on the substrate;
a power supply comprising a plurality of power lines configured to provide power to the plurality of light emitting devices; and
a controller configured to:
control the power supply to turn on power to each power line at least four times in one frame, and turn off power to each power line of the plurality of power lines at least four times in the one frame, wherein a total time in which power is turned on to each power line across an entirety of the one frame is less than a total time in which the power is turned off to each power line across the entirety of the one frame.

2. The display apparatus of claim 1, wherein the controller is further configured to control the power supply to turn on power to each power line of the plurality of power lines for a same period of time.

3. The display apparatus of claim 2, wherein the controller is further configured to control the power supply to turn on power to the plurality of power lines at different times.

4. The display apparatus of claim 3, wherein the controller is further configured to:
control the power supply to, based on power to a first power line among the plurality of power lines being turned off from an on-state, turn on power to a second power line among the plurality of power lines; and
control the power supply to, based on the second power line being turned off, turn on power to the first power line.

5. The display apparatus of claim 3, wherein the controller is further configured to:

control the power supply to, based on power to a first power line among the plurality of power lines being turned off from an on-state, turn on power to a second power line among the plurality of power lines;

control the power supply to, based on power to the second power line among the plurality of power lines being turned off from an on-state, turn on power to a third power line among the plurality of power lines;

control the power supply to, based on power to the third power line among the plurality of power lines being turned off from an on-state, turn on power to a fourth power line among the plurality of power lines; and control the power supply to, based on power to the fourth power line among the plurality of power lines being turned off from an on-state, turn on power to the first power line among the plurality of power lines.

6. The display apparatus of claim 1, wherein the plurality of light emitting devices form a plurality of dimming blocks, and each dimming block of the plurality of dimming blocks includes a predetermined number of light emitting devices, and wherein the plurality of power lines are configured to provide power to the plurality of dimming blocks.

7. The display apparatus of claim 1, wherein the controller is further configured to control the power supply such that a time for which power to each power line of the plurality of power lines remains turned off by a single turn-off is shorter than an afterimage perception time.

8. A method of controlling a display apparatus including a substrate, a plurality of light emitting devices arranged in a two-dimensional (2D) matrix on the substrate, and a power supply comprising a plurality of power lines configured to provide power to the plurality of light emitting devices, the method comprising:

controlling the power supply to turn on power to the plurality of power lines at different times; and controlling the power supply to turn on power to each power line at least four times in one frame, and turn off power to each power line of the plurality of power lines at least four times in the one frame, wherein a total time in which power is turned on to each power line across an entirety of the one frame is less than a total time in which the power is turned off to each power line across the entirety of the one frame.

9. The method of claim 8, further comprising controlling the power supply to turn on power to each power line of the plurality of power lines for a same period of time.

10. The method of claim 8, wherein the controlling the power supply to turn on power to the plurality of power lines at different times comprises:

controlling the power supply to, based on power to a first power line among the plurality of power lines being turned off from an on-state, turn on power to a second power line among the plurality of power lines; and controlling the power supply to, based on power to the second power line being turned off, turn on power to the first power line.

11. The method of claim 8, wherein the controlling the power supply to turn on power to the plurality of power lines at different times comprises:

controlling the power supply to, based on power to a first power line among the plurality of power lines being turned off from an on-state, turn on power to a second power line among the plurality of power lines;

controlling the power supply to, based on power to the second power line among the plurality of power lines being turned off from an on-state, turn on power to a third power line among the plurality of power lines;

controlling the power supply to, based on power to the third power line among the plurality of power lines being turned off from an on-state, turn on power to a fourth power line among the plurality of power lines; and controlling the power supply to, based on power to the fourth power line among the plurality of power lines being turned off from an on-state, turn on power to the first power line among the plurality of power lines.

12. The method of claim 8, wherein the plurality of light emitting devices form a plurality of dimming blocks, and each dimming block of the plurality of dimming blocks includes a predetermined number of light emitting devices, and wherein the plurality of power lines are configured to provide power to the plurality of dimming blocks.

13. The method of claim 8, wherein the controlling the power supply to turn on and off power to each power line of the plurality of power lines a plurality of times in the one frame comprises controlling the power supply such that a time for which power to each power line of the plurality of power lines remains turned off by a single-turn off is shorter than an afterimage perception time.

14. A display apparatus comprising:

a plurality of light emitting devices;

a power supply comprising a plurality of power lines configured to provide power to the plurality of light emitting devices; and a controller configured to:

control the power supply to turn on power to each power line at least four times in one frame, and turn off power to each power line of the plurality of power lines at least four times in the one frame, wherein a total time in which power is turned on to each power line across an entirety of the one frame is less than a total time in which the power is turned off to each power line across the entirety of the one frame; and control the power supply to turn on power to each power line of the plurality of power lines for a same period of time.

15. The display apparatus of claim 14, wherein the controller is further configured to control the power supply to turn on power to the plurality of power lines at different times.

16. The display apparatus of claim 15, wherein the controller is further configured to:

control the power supply to, based on power to a first power line among the plurality of power lines being turned off from an on-state, turn on power to a second power line among the plurality of power lines; and control the power supply to, based on power to the second power line being turned off, turn on power to the first power line.

17. The display apparatus of claim 14, wherein the plurality of light emitting devices form a plurality of dimming blocks, and each dimming block of the plurality of dimming blocks includes a predetermined number of light emitting devices, and wherein the plurality of power lines are configured to provide power to the plurality of dimming blocks.

* * * * *